(12) United States Patent
Chen et al.

(10) Patent No.: US 6,854,077 B2
(45) Date of Patent: Feb. 8, 2005

(54) APPARATUS AND METHOD FOR PROVIDING TURBO CODE INTERLEAVING IN A COMMUNICATIONS SYSTEM

(75) Inventors: Jiangnan Chen, Darien, IL (US); Louay Jalloul, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 407 days.

(21) Appl. No.: 09/775,950

(22) Filed: Feb. 2, 2001

(65) Prior Publication Data
US 2002/0035709 A1 Mar. 21, 2002

Related U.S. Application Data

(60) Provisional application No. 60/223,548, filed on Aug. 5, 2000.

(51) Int. Cl.[7] .......................... G11C 29/00; H03M 13/03
(52) U.S. Cl. ...................... 714/702; 714/786; 714/787; 714/788; 714/761; 714/762
(58) Field of Search .................. 714/702, 786–788, 714/761, 762

(56) References Cited

U.S. PATENT DOCUMENTS

| | | | | |
|---|---|---|---|---|
| 5,996,104 A | * | 11/1999 | Herzberg | ..................... 714/755 |
| 6,304,991 B1 | * | 10/2001 | Rowitch et al. | ............. 714/755 |
| 6,314,534 B1 | * | 11/2001 | Agrawal et al. | ............. 714/702 |
| 6,334,197 B1 | * | 12/2001 | Eroz et al. | .................... 714/701 |
| 6,493,815 B1 | * | 12/2002 | Kim et al. | .................... 711/217 |
| 6,598,202 B1 | * | 7/2003 | Kim et al. | .................... 714/786 |

* cited by examiner

Primary Examiner—Greg J. Lamarre
Assistant Examiner—Esaw T Abraham
(74) Attorney, Agent, or Firm—Steven A. Mag

(57) ABSTRACT

A communication system 100 employs turbo encoding having a turbo interleaver 106 that interleaves input data 101 efficiently with little use of system resources. The turbo interleaver 106 reads address locations of the data bits into an interleaver matrix array 206 row by row and interleaves the address locations by bit reversal of the row indexes with accompanying permutation of the corresponding address locations in the rows of the matrix 206, bit reversal of the column indexes with accompanying permutation of the corresponding address locations in the columns of the matrix 206 and shifting the address locations within each row a predetermined number of column locations based on the particular row number.

19 Claims, 4 Drawing Sheets

APPARATUS AND METHOD FOR PROVIDING TURBO CODE INTERLEAVING IN A COMMUNICATIONS SYSTEM

RELATED APPLICATIONS

This application claims the benefit of U.S. provisional application No. 60/223,548, filed Aug. 5, 2000.

BACKGROUND OF THE INVENTION

The present invention relates to an apparatus and method for interleaving and deinterleaving data transmitted in a communication system and, more particularly, in a communication system employing turbo codes.

Transmission of digital data is inherently prone to noise and interference that may introduce errors into the transmitted data. Accordingly, error detection schemes are utilized in the art to determine whether errors have been introduced into transmitted data. Examples of such schemes include, for example, adding a cyclic redundancy check (CRC) field to a data packet or frame to determine errors based on comparison of a sum of the data received with a checksum in the CRC field.

Another approach to mitigating the effects of errors introduced into transmitted data is the use of forward error correction such as convolutional codes, which, when introduced to a data frame, allow a receiver of the received data to correctly determine the transmitted data even when errors may have occurred during transmission. Convolutional codes introduce redundancy into the transmitted data and pack the transmitted data into packets in which the value of each bit is dependent on earlier bits in the sequence. Hence, when an error occurs the receiver can reconstruct the original data by tracing back possible sequences in the received data. Further improvement of the performance of a transmission channel can be achieved by using channel interleavers with convolutional coding schemes, which the entire original packet through the use of interleaving and can, thus, more readily be overcome during decoding of the coded data. Further improvements have included multiple-component codes that encode the packet more than once either in parallel or in series. As an example, the prior art is known to employ an error correction scheme that uses at least two concatenated rescursive systematic convolutional coders in parallel and is commonly referred to as "turbo coding".

There exist many variations of turbo coders, but most types of turbo coders use multiple encoders in parallel separated by interleaving steps. Turbo codes get their performance advantage over convolutional codes through the iterative decoding process. Turbo codes provides performance with respect to noise tolerance in a communication system that was previously unavailable in the prior art. Specifically, turbo coding allows communications at levels of energy-per-bit per noise power spectral density ($E_b/N_0$) that were previously unacceptable using prior art forward error correction schemes.

The performance of turbo codes is sensitive to the interleavers used between the encoders. Previous interleaving schemes used for turbo encoders have included employment of a linear congruentional sequence interleaver requiring look up tables containing coefficients and other values used by a linear congruentional sequence interleaver to calculate row and column indexes. This system, however, requires a large amount of memory and, thus, is less effective in efficiently utilizing system resources.

Based on the problems with prior art interleavers, there is a need for an interleaving scheme within a turbo encoded communication system that is capable of receiving and interleaving any N number of bits in a transmission frame while efficiently utilizing system resources.

DETAILED DESCRIPTION OF THE PREFERRED EMBODIMENTS

The present invention addresses the problem of flexibly accommodating any N number of bits within a frame while efficiently utilizing resources by utilizing a more simply implemented interleaving scheme. In the present invention, specifically, rows and columns in an interleaver matrix are bit reversed and select rows in the matrix are also shifted according to a prescribed condition to accomplish a more easily implemented interleaver that does not require look-up tables and, thus, effectively conserves system resources.

In communication systems, such as the evolution of the IS-2000 Code Division Multiple Access (CDMA) standard, data packets are allowed to be of various size N that must fit in a frame duration (e.g. 5 msec). Hence, a turbo encoder interleaver must allow for the various size blocks under the standard to be input to the encoder. The use of look-up tables specific to each of these fixed size blocks as used in the current IS-2000 standard can present a large usage of memory resources within a turbo code interleaver. The turbo code interleaver of the present invention, on the other hand, is more simply implemented, allows flexible block size with a granularity of one bit, does not sacrifice link performance and does not require look-up tables that consume system resources.

Figure 1:
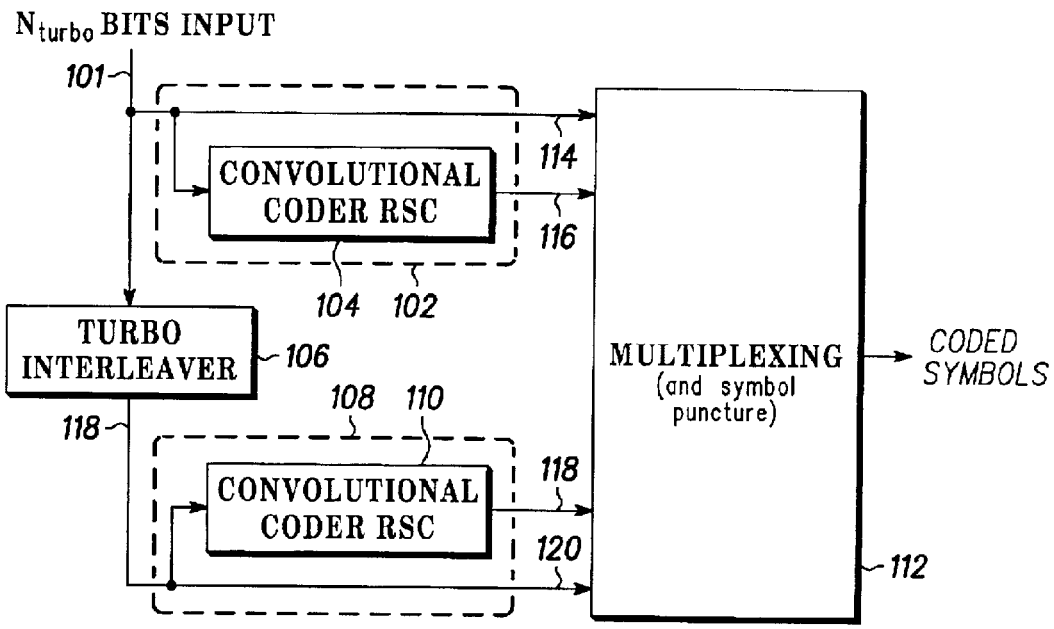
FIG. 1 illustrates a turbo encoder utilized in an embodiment of the present invention.

A turbo encoder according to the present invention is shown in FIG. 1 at 100. At an input 101, $N_{turbo}$ bits within a fixed size data frame are input to the encoder 100. The turbo encoder shown includes two parallel concatenated convolutional coders 102 and 108 and a turbo interleaver 106 located between the input and one of the convolutional coders (i.e., 108). Within each of the coders 102 and 108 is a respective convolutional coder 104 and 110 that employs a recursive systematic code (RSC) according to a preferred embodiment. The first coder 102 receives the bit input 101 and simply passes on these data bits as shown by output 114. Additionally, the first coder 102 includes the convolutional coder 104 that outputs parity symbols on output 116. The second coder 108 receives an interleaved output 118 from the turbo interleaver 106 and outputs the interleaved data at output 118 and a second set of parity symbols on output 120 from the convolutional coder 110.

The outputs 114, 116, 118, and 120 are input to a multiplexer 112 and are thereby multiplexed into an output data stream of coded symbols. In other preferred embodiments, the coded symbols may by punctured to increase the coding rate and provide improved spectral efficiency as indicated in multiplexer block 112. It will be appreciated by those of skill in the art that additional coders and interleaver pairs may be added in parallel to reduce the coding rate and, hence, enhance forward error correction. Additionally, the turbo coder can consist of a serial concatenated convolutional coder, rather than the parallel coder shown in FIG. 1. Furthermore, the coders 102 and 108 may utilize various types of coders known in the art (e.g., block coders) instead of the convolutional recursive systematic coders shown in FIG. 1.

Figure 2:
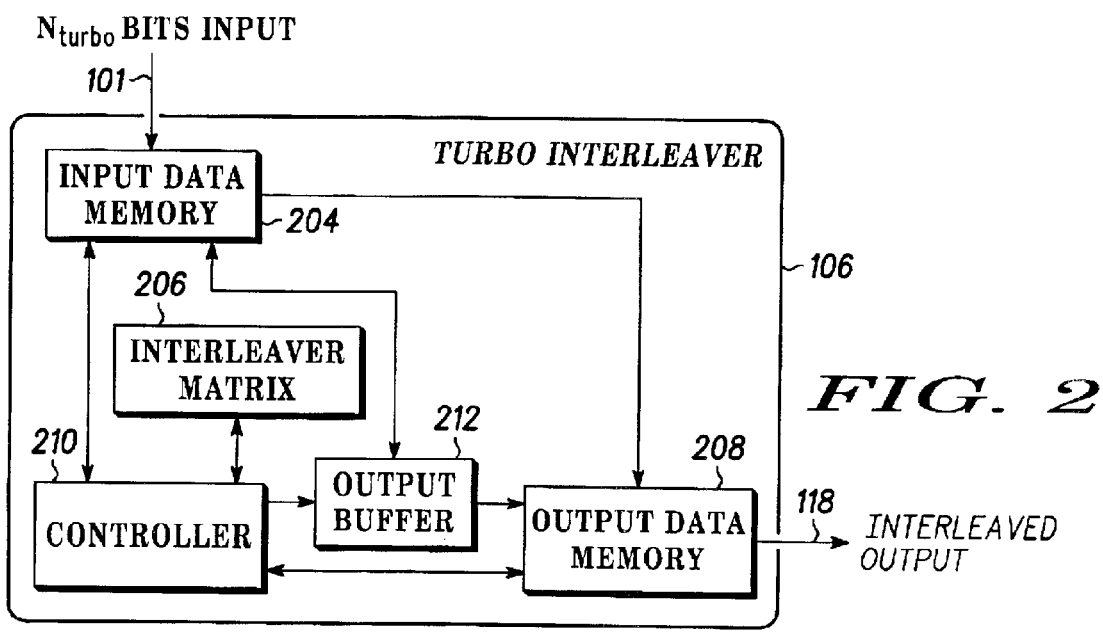
FIG. 2 is a block diagram of a turbo interleaver used in the turbo coder illustrated in FIG. 1.

The turbo interleaver 106 used in the present invention is further illustrated in FIG. 2. Within the turbo interleaver 106 are included an input data memory 204, an interleaver matrix 206, a controller 210, an output buffer 212, and an output data memory 208. The $N_{turbo}$ bits 101 of a data frame are input to the input data memory 204 of the turbo interleaver 106 in an N number of corresponding address locations within the memory 204. The input registers 202 then temporarily store the N number of bits into an addressed data memory 204, each bit having a corresponding address within the data memory 204. In a preferred embodiment, the controller 210 reads the number $N_{turbo}$ bits contained within the data frame and decides the number of rows and columns that will be set for the interleaver matrix 206. Specifically, the controller 210 sets the number of rows equal to a value of $2^m$ and the number of columns to a value of $2^n$ such that $2^{m+n}$ is greater than or equal $N_{turbo}$. The controller 210 also sets the numbers m and n such that n is greater than or equal to m and that the absolute value of m-n is less than or equal to 1 (i.e., 2m-n2#1) such that the $2^m \times 2^n$ array is almost a square matrix. Once the values of n and m have been determined by the controller 210, the controller 210 stores the values $2^m$ and $2^n$ to input registers within the controller 210. It will be appreciated by those skilled in the art that the controller 210 may be located external to the turbo interleaver 106 with input registers in the interleaver 106 or integral with the interleaver as shown in the preferred embodiment of FIG. 2.

Under the direction of the controller 210, the addresses of the data bits within the data memory 204 are read into the interleaver matrix array 206 in a row by row fashion with $2^m$ rows and $2^n$ columns. The interleaver matrix array 206 is shown for representational purposes separate from controller 210, but preferably is contained within the controller 210. Each of the rows and columns in the interleaver matrix 206 are assigned indexes represented by a binary number. For example, in an array having 4 rows, the indexes for rows 1–4 would be binary numbers 00, 01, 10, and 11. The controller 210 bit reverses the row index values and permutes the corresponding address locations to the bit reversed locations. Next, the controller 210 bit reverses the column indexes within the interleaver matrix array 206 similar to the bit reversal previously performed on the row indexes. The controller 210 then permutes the data memory addresses in accordance with the bit reversal of the column indexes.

As a final step in the interleaving process, the controller 210 then right shifts the address values in the rows as determined by the particular row. The first row of the array is not shifted. The second row is shifted $2^m-1$ times; the third row shifted $2^m-2$ times and so forth down the rows until the $m^{th}$ row, which is shifted one time (i.e., the rows are shifted according to the relationship $[2^m-(\text{row number}-1)]$). It will be appreciated by those skilled in the art, however, that the rows could be shifted left instead of right.

After permutation of the matrix by shifting addresses within the rows, the addresses are read out of the interleaver matrix 206 column by column starting with the first column.

The controller 210 directs the addresses to be read to the output buffer 212, which, in turn, accesses the data within the input data memory 204 at the addresses from the interleaver matrix 206 in sequential order. The output buffer 212 delivers the addresses to be sequentially read out to the input data memory 204, which sequentially accesses and transmits the data bit stored at the addresses to output data memory 208, which, in turn, outputs the interleaved data on to output 118.

As an example of the interleaving method of the present preferred embodiment, an $N_{turbo}$ equal to 32 is assumed yielding an interleaver matrix array with the size 32 (i.e., m=2 and n=3) with $2^2$ or 4 rows and $2^3$ or 8 columns. The interleaver matrix is first written row by row as:

$$\begin{bmatrix} 1 & 2 & 3 & 4 & 5 & 6 & 7 & 8 \\ 9 & 10 & 11 & 12 & 13 & 14 & 15 & 16 \\ 17 & 18 & 19 & 20 & 21 & 22 & 23 & 24 \\ 25 & 26 & 27 & 28 & 29 & 30 & 31 & 32 \end{bmatrix}$$

The first operation is row bit reversal wherein the binary row indexes (00, 01, 10, 11) are bit reversed (i.e., 00, 10, 01, 11) and the rows are permuted accordingly to obtain the following matrix:

$$\begin{bmatrix} 1 & 2 & 3 & 4 & 5 & 6 & 7 & 8 \\ 17 & 18 & 19 & 20 & 21 & 22 & 23 & 24 \\ 9 & 10 & 11 & 12 & 13 & 14 & 15 & 16 \\ 25 & 26 & 27 & 28 & 29 & 30 & 31 & 32 \end{bmatrix}$$

The column binary indexes (000, 001, 010, 011, 100, 101, 110, 111) are then bit reversed (i.e., 000, 100, 010, 110, 001, 101, 011, 111) and the columns are permuted accordingly to obtain the following matrix:

$$\begin{bmatrix} 1 & 5 & 3 & 7 & 2 & 6 & 4 & 8 \\ 17 & 21 & 19 & 23 & 18 & 22 & 20 & 24 \\ 9 & 13 & 11 & 15 & 10 & 14 & 12 & 16 \\ 25 & 29 & 27 & 31 & 26 & 30 & 28 & 32 \end{bmatrix}$$

Since the 2-dimensional bit reversal operations still produce a large degree of regularity to the array, which also increases the multiplicity of the interleaver, the rows are then shifted to reduce the multiplicity. It is noted that the first row, however, is never shifted. Based on the rule of right shifting the rows according to the relationship $2^m-(\text{row number}-1)$, the final interleaved matrix is as follows:

$$\begin{bmatrix} 1 & 5 & 3 & 7 & 2 & 6 & 4 & 8 \\ 22 & 20 & 24 & 17 & 21 & 19 & 23 & 18 \\ 12 & 16 & 9 & 13 & 11 & 15 & 10 & 14 \\ 32 & 25 & 29 & 27 & 31 & 26 & 30 & 27 \\ & & & & & & & 10 \end{bmatrix}$$

The columns of the final interleaved matrix are then read out column by column. For example, the read out address sequence would be 1, 22, 12, 32, 5, etc.

In the final interleaved matrix, the difference between adjacent elements is randomized such that there is no multiplicity within the matrix. Furthermore, there is no single pair of elements that will cause the weight two code input to propagate to the output codeword for turbo encoders that operate in systems adopting the current standards (e.g., IS2000 and WCDMA).

It is noted that in instances where the number of $N_{turbo}$ bits is less than the number of addresses in the interleaver matrix (i.e., $2^{m+n} > N_{turbo}$), those addresses beyond the $N^{th}$ address are simply held invalid. For example, assuming in the above example that the $N_{turbo}$ number of bits was equal to 31 rather than 32, for any address over the number of 31 (i.e., address 32), these addresses are simply discarded since the input data memory 204 only contains 31 stored bits in the first 31 storage registers.

The interleaver shown in FIG. 2 is representational of a system that assumes the entire interleaver matrix 206 is written prior to interleaving the data memory addresses within the interleaver matrix 206. However, in an implementation according to another preferred embodiment of the present invention, interleaving is performed as the bit stream is input since extra time and resources would be utilized otherwise. That is, since the $N_{turbo}$ bits are input in a serial stream, the interleaver according to the present preferred embodiment is adapted to interleave the bit addresses of the $N_{turbo}$ bits as they are received, rather than waiting for an entire matrix to be written.

Figure 3:
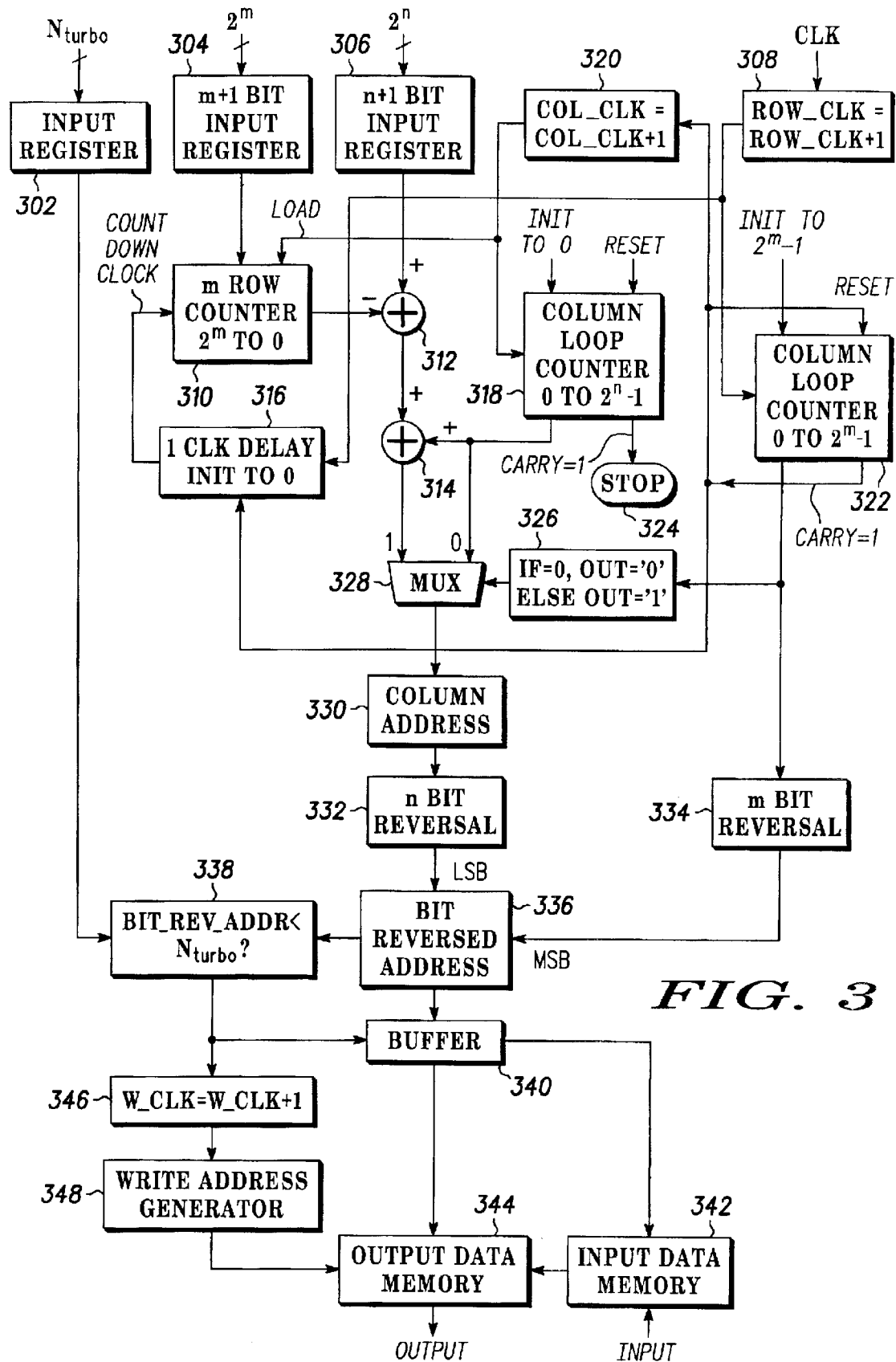
FIG. 3 is a block/flow diagram of the turbo interleaver illustrated in FIG. 2.
Figure 4:
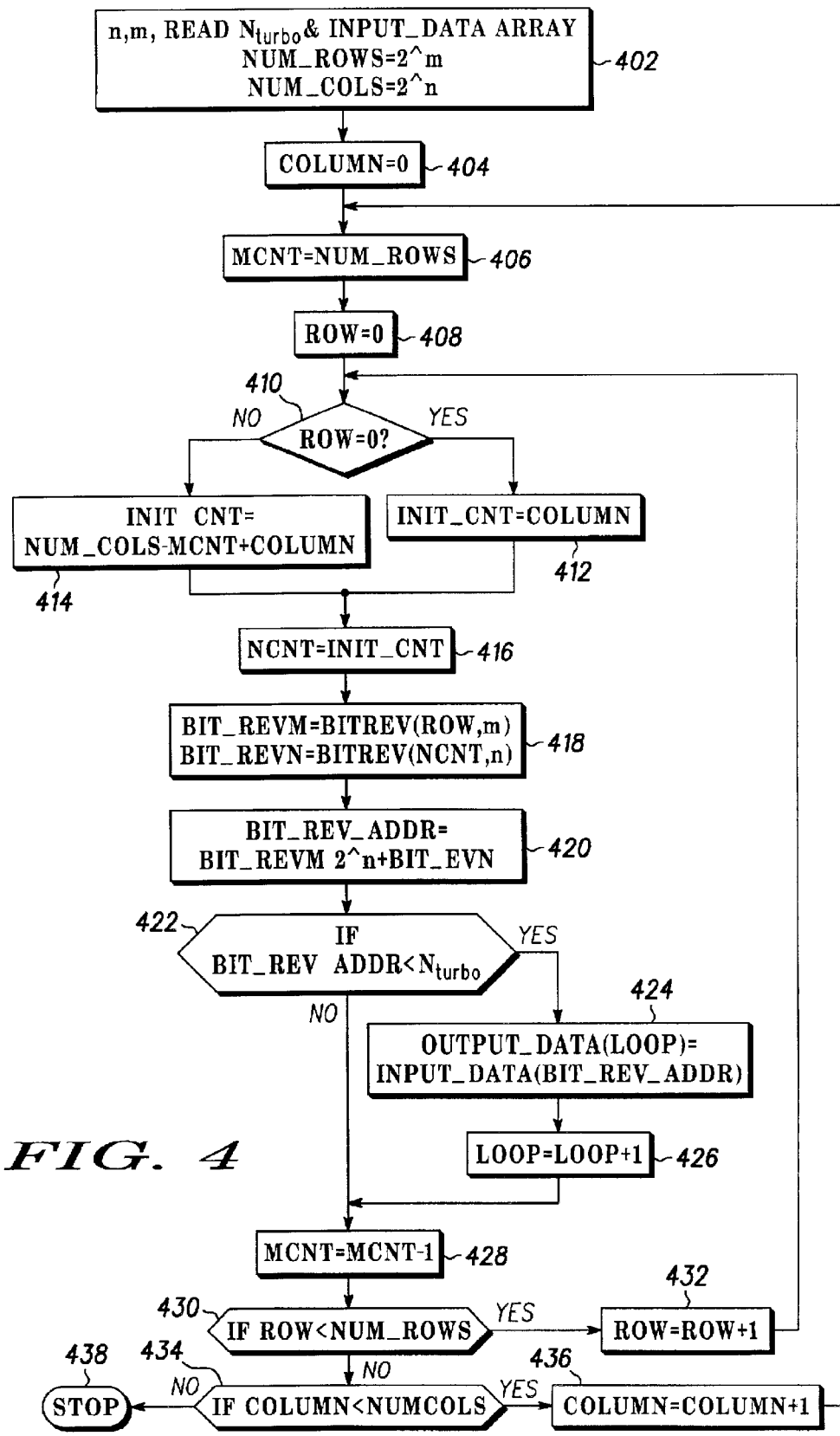
FIG. 4 is a flow diagram illustrating the process performed by a turbo interleaver according to an embodiment of the present invention.

Representational of the foregoing embodiment, FIG. 3 shows a block/flow diagram of a turbo interleaver and FIG. 4 illustrates the method steps taken to sequentially interleave the data bits as they arrive at the turbo interleaver.

In FIG. 3 an input register 302 receives the number $N_{turbo}$, an input register 304 receives the number of columns (i.e., $2^m$) and an input register 306 receives the number of columns (i.e., $2^n$). These registers 302, 304, and 306 correlate to the input registers within the controller 210, described in connection with FIG. 2. The interleaver also has a clock input 308. A clock clk (which is a periodic count) is used to synchronize the operation of the interleaver and ensures that each bit is handled sequentially. The clock input 308 receives the clock signal clk and sets a row clock counter ROW_CLK equal to a previous value of the ROW_CLK during the previous clock period and adds a value of 1 to the previous value.

When the row clock is first started, an output signal is sent to a clock delay circuit 316 that, in turn, is controlled by a carryover bit from a row loop counter 322. The row clock is also input to the row loop counter 322, which is initialized to the value of $2^m-1$ and counts down from $2^m-1$ to 0. When the row loop counter 322 reaches 0 count a carry bit of value "1" is output to reset the counter 322, increment a column clock COL_CLK shown in 320 and allow the row clock signal to be delivered to the m-row counter 310 in order to decrement this counter 310 via the clock delay 316. The output binary number from the row loop counter 322 is m-bit reversed by m-bit reversal 334 and is also used to toggle a multiplexer 328 between a '0' input and a '1' input.

A summing junction 312 receives the number of columns $2^n$ from the n+1 bit input register 306 and subtracts the value of the m-row counter 310. The output of the summing junction 312 is input to a second summing junction 314, which adds the value of the column loop counter 318, which counts from 0 to $2^n-1$. An output of the second summing junction 314 is input to input '1' of multiplexer 328. The output of the column loop counter 318 is also directly input to the '0' input of the multiplexer 328. The combination of the summing junction 312 and 314 accomplishes right shifting of the address locations within the interleaver matrix.

The value passed through the multiplexer 328 is set as a current column address as indicated by block 330. This column address, which is a binary value, is then end bit reversed by end bit reversal 332 and delivered to a bit reversed addressed assembler 336, where the n-bits (column address bits) are set as the least significant bits in the bit reversed address. Similarly, the output of the row loop counter 322 is a row address and is delivered to m-bit reversal 334 for bit reversal of the row address. The bit reversed row address is then delivered to the bit reversed addressed assembler 336 and set as the most significant bits of the bit reversed address. The bit reversed address is then sent to block 338, which determines whether the bit reversed address is less than the $N_{turbo}$ number of bits. If this condition is true, an output of '1' is sent to enable a buffer 340 (corresponding to output buffer 212 in FIG. 2) to pass the bit reversed address to the input data memory 342 (corresponding to the input data memory 204 of FIG. 2) for reading of the data bit stored in the location of the bit reversed address. Conversely, if the bit reverse address is greater than the $N_{turbo}$ number of bits at block 338, then this indicates that the address is not valid (this occurring in an interleaver matrix that has a size greater than $N_{turbo}$) and no further action is taken during that particular clock cycle.

When the data in the bit reversed address is read from the input data memory 342, the data is sent to the output data memory 344 (corresponding to output data memory 208), which is, in tern, delivered to coder 108 as shown in FIG. 1. With each clock cycle where data is output, a write clock w_clk is incremented by a value of 1 as shown at block 346 and sent to a write address generator 348 to keep a count of the number of bits that have been output from the output data memory thus far.

FIG. 4 illustrates a flow chart of the interleaver illustrated in FIG. 3. In an initializing step 402, the number of rows Num_Rows is set equal to $2^m$, the number of columns Num_Cols is set equal to $2^n$ and the number of data bits $N_{turbo}$ are read to the input registers. Additionally, a loop counter is initialized at 0. The flow then proceeds to step 404 where the column number is initialized to 0 and flow then proceeds to step 406. At step 406, the m-bit count mcnt is set equal to the number of rows Num_Rows (i.e., $2^m$). Next, flow proceeds to step 408 where a row counter (row) is initialized at 0. Decision step 410 determines whether the row counter (row) is equal to 0. If the row counter (row) is equal to 0, an initial count Init_Cnt is set equal to the column count (column) as shown in step 412. If, as determined at step 410, the row count (row) is not equal to 0, the initial count Init_Cnt is set equal to the number of columns Num_Cols (i.e., $2^n$) minus the m-bit count mcnt plus the column count (column) in step 414. From both steps 412 and 414 the flow proceeds to step 416 where an n-bit count ncnt is set equal to the initial count Init_Cnt.

At step 418, the interleaver performs bit reversal of the m-bit value of the row count (this corresponds to the block 334 of FIG. 3) and bit reversal of the particular n-bit of the column count ncnt (this corresponds to block 332 of FIG. 3). Next in step 420 the bit reverse address Bit_Rev_Addr is set equal to the reversed m-bits Bit_Revm multiplied by $2^n$ plus the bit reversed n-bits Bit_Revn. This function in step 420 results in the m-bits being the most significant bits in the bit reversed address and the n-bits being the least significant bits in the bit reversed address (note that this corresponds to the bit reverse address generator 336 shown in FIG. 3). The bit reverse address Bit_Rev_Addr is then compared to $N_{turbo}$ to determine whether or not the bit reversed address Bit_Rve_Addr is less than $N_{turbo}$. If it is not, a condition arising from a matrix array having more elements than $N_{turbo}$, flow proceeds directly to step 428 where the m-count mcnt is decremented by one (this corresponds to the count down clock input to m-row counter 310).

Alternatively, if the bit reverse address Bit_Rev_Addr is within the $N_{turbo}$ number of bits as determined in step 422, flow proceeds to step 424 where the data to be output from the output data memory is set equal to the input data stored at the particular bit reversed address. After this is accomplished, a loop counter (loop) is incremented by 1 as shown in step 426 and subsequently proceeds to step 428 for decrementing of the row count mcnt.

Flow next proceeds to step 430 where a determination is made whether the row count (row) is less than the number of rows Num_Rows thus indicating whether or not a particular row of the matrix has been completely interleaved. If the row count is less than the number of rows, flow proceeds to step 432 where the row count is incremented by 1 (this corresponding to the operation of row loop counter 322 shown in FIG. 3) and flow returns to step 410. On the other hand, if the row count (row) is equal to the total number of rows Num_Rows as determined in step 430, the flow proceeds to step 434 to determine whether the column count (column) is less than the number of columns Num_Cols. If the column count is less than the number of columns Num_Cols, indicating that all of the columns have not yet been interleaved, flow proceeds to step 435 for an incrementing of the column count (column) by 1 (note this corresponds to incrementing the column loop counter 318 as shown in FIG. 3) and flow proceeds back to step 406 where the row count mcnt is reset to equal the total number of rows Num_Rows. Conversely, if the column count (column) is equal to the number of columns as determined in step 434, this indicates that the entire matrix has been interleaved and flow proceeds to step 438 (corresponding to state 324 in FIG. 3) to stop the interleaving of the particular data frame comprised of the $N_{turbo}$ bits.

Figure 5:
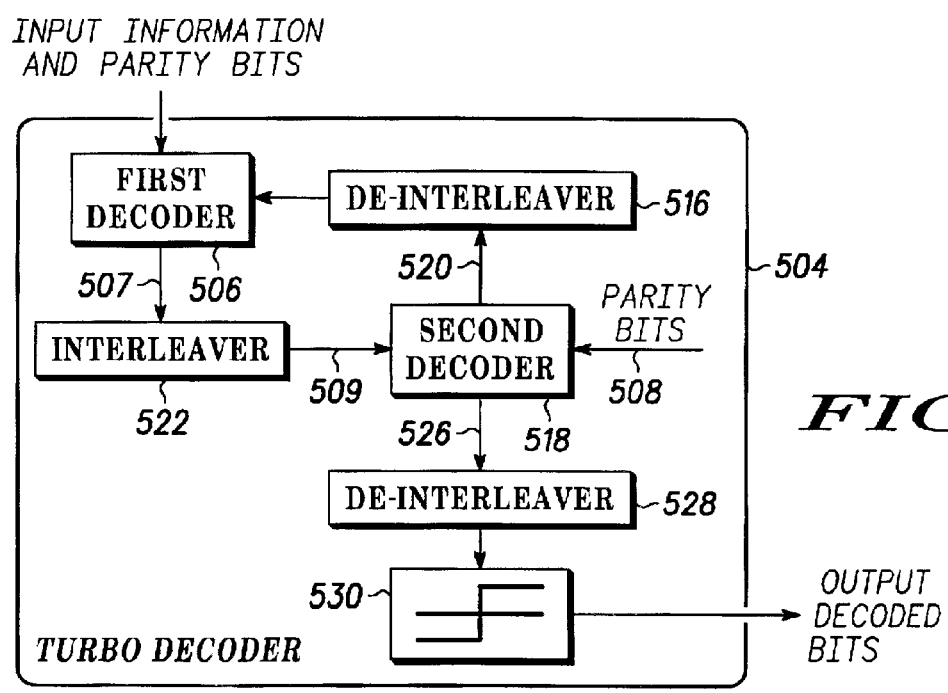
FIG. 5 illustrates a communication system receiver employing a turbo decoder according to an embodiment of the present invention.

FIG. 5 illustrates a communication system receiver turbo decoder 504 for receiving and decoding the coded symbols that are transmitted. Within the turbo decoder 504 is a first decoder 506, which decodes the coded symbols and outputs the soft bits 507, which are, in turn, interleaved using a turbo interleaver 522 operating in the same manner as turbo interleaver 106 described in connection with FIGS. 1 and 2. The output 509 of the turbo interleaver 522 is input to a second decoder 518. Another input to the second decoder 518 is the parity bits 508. The output 520 of the second decoder 518 is the input to the de-interleaver 516, which performs the reverse functions of the turbo interleaver 106 shown in FIGS. 1 and 2. The iteration between the first decoder 506 and the second decoder 518 is repeated until a prescribed number of iterations is achieved or a stopping rule stops the decoding process. The output 526 of the second decoder 518 is de-interleaved using a de-interleaver 528 that performs the reverse function of the turbo interleaver 106 described in connection with FIGS. 1 and 2. The output of de-interleaver 528 is quantized to a single bit (e.g., a "0" or a "1" depending on the sign of the output from the de-interleaver 528) using a hard limiter 530 whose output is the decoded bits.

The present invention has been described for exemplary purposes in terms of several preferred embodiments. It should be understood, however, that persons of ordinary skill in the art may otherwise embody its broad teachings without departing from its fair scope.

What is claimed is:

1. A interleaving method for interleaving data elements in a communication system employing turbo codes, the method comprising the steps of:

writing address locations of the data elements sequentially by rows into a matrix having a predetermined number of bit storage locations arranged in a first predetermined number of rows having corresponding row indexes and a second predetermined number of columns having corresponding column indexes;

bit reversing the row indexes for the first predetermined number of rows and permuting the corresponding address locations of the data elements;

bit reversing the column indexes for the second predetermined number of columns and permuting the corresponding address locations of the data elements: and shifting bit storage locations of one or more of the first predetermined number of rows a respective predetermined number of columns.

2. The method according to claim 1, further comprising the steps of:

determining an N number of bits within a frame to be transmitted and setting the predetermined number of bit storage locations equal to N; and setting the first predetermined number of rows and second predetermined number of columns to $2^m$ and $2^n$, respectively, where the values m and n are set such that $2^{n+m}$ is greater than or equal to N.

3. The method according to claim 2, wherein the values of m and n are set such that as is greater than or equal to m and that the absolute value of the difference of values m and as is less than or equal to one.

4. The method according to claim 2, wherein data elements in each particular row of the matrix are each shifted in a predetermined direction within the matrix a specified number of columns as determined by the relationship $2^m$-(row#-1), where row# is a number of the particular row in the matrix and $2^m$ is the total number of rows in the matrix.

5. The method according to claim 1, further comprising the step of reading the data elements out of the matrix column by column starting with a first column after the columns have been reversed and the rows have been reversed and shifted.

6. The method according to claim 1, wherein the steps of reversing bit storage locations for the first predetermined number of rows, reversing bit storage locations for the second predetermined number of columns, and shifting bit storage locations of each of the second predetermined number of rows a respective predetermined number of columns are performed for each data element when each individual data element is written to the matrix.

7. An interleaver comprising:

an input device configured for receiving and temporarily storing data elements in an input memory, the input device also configured to write addresses of the elements in the input memory sequentially by rows into a matrix of at least a predetermined number of bit storage locations having a first predetermined number of rows and a second predetermined number of columns;

a controller configured to bit reverse row indexes for the first predetermined number of rows and permute the corresponding data elements, bit reverse column indexes for the second predetermined number of columns and permute the corresponding data elements, and shift bit storage locations of one or more of the first predetermined number of rows a respective predetermined number of columns; and an output device configured to sequentially read the interleaved input memory addresses from the columns of the matrix and read and transmit data elements stored at corresponding memory addresses in the sequential read order of the interleaved input memory addresses.

8. The interleaver according to claim 7, wherein the controller is further configured to:
  determine an N number of bits within a frame to be transmitted;
  set the predetermined number of bit storage locations equal to N; and
  set the first predetermined number of rows and second predetermined number of columns to $2^m$ and $2^n$, respectively, where the values m and n are set such that $2^{n+m}$ is greater than or equal to the at least N number of bit storage locations.

9. The interleaver according to claim 8, wherein the values of m and n are set such that n is greater than or equal to in and that the absolute value of the difference of values m and n is less than or equal to one.

10. The interleaver according to claim 7, wherein the output device sequentially reads the data elements out of the matrix column by column starting with a first column.

11. The interleaver according to claim 7, wherein the controller is configured to reverse the bit storage locations for the first predetermined number of rows, reverse the bit storage locations for the second predetermined number of columns, and shift the bit storage locations of each of the second predetermined number of rows a respective predetermined number of columns for each data element when each individual data element is written to the matrix.

12. The interleaver according to claim 7, wherein the controller is configured to shift data elements in each particular row of the matrix a predetermined direction within the matrix a specified number of columns as determined by the relationship $2^m-(\text{row}\#-1)$, where row# is a number of the particular row in the matrix and $2^m$ is the total number of rows in the matrix.

13. A data transmission system employing turbo encoding comprising:
  a turbo encoder for turbo encoding received data frames and transmitting the encoded data frames within the data transmission system, the turbo encoder including:
  a plurality of coders for coding the received data frame; and
  an interleaver located between an input to the turbo encoder and one of the plurality of coder, the interleaver configured to interleave address locations of bits within a matrix having a first predetermined number of rows and a second predetermined number of columns by bit reversing row indexes for the first predetermined number of rows and permuting the corresponding data elements, bit reversing column indexes for the second predetermined number of columns and permuting the corresponding data elements, and shifting bit storage locations of one or more of the first predetermined number of rows a respective predetermined number of columns; and
  a decoder configured to receive and decode the turbo encoded data frames transmitted by the turbo encoder, the decoder including a de-interleaver that receives the interleaved reassembles the address locations of bits within the matrix by reversing the interleaved output of the interleaver using reverse steps of the interleaver.

14. An interleave comprising:
  an input data memory configured to store an N number of bits at corresponding input data memory addresses;
  an interleaver matrix configured to read and store the input data memory addresses in at least a two-dimensional matrix having a first predetermined number of rows and a second predetermined number of columns, each of the rows and columns having an assigned index value;
  a controller configured to set the first predetermined number of rows and the second predetermined number of rows based on the N number of bits using a prescribed algorithm; the controller also configured to interleave the data memory address in the interleaver matrix by bit reversing the row index values for the first predetermined number of rows and permuting the corresponding address locations of the data elements, bit reversing the column index values for the second predetermined number of columns and permuting the corresponding address locations of the data elements, and shifting bit storage locations of one or more of the first predetermined number of rows a respective predetermined number of columns; the controller further configured to read out interleaved data bit addresses in the interleaver matrix column by column to produce an interleaved output read sequence;
  an output buffer receiving the interleaved output read sequence from the controller, the output buffer configured to direct the input data memory to read out data bit according to the interleaved output read sequence; and
  an output data memory configured to write data bits read out from the input data memory according to the interleaved output read sequence and transmit the read bits to a communication system.

15. The interleaver according to claim 14, wherein the interleaver matrix is effected within the controller.

16. The interleaver according to claim 14, wherein the controller is further configured to set the first predetermined number of rows and second predetermined number of columns to $2^m$ and $2^n$, respectively, where the values m and n are set such that $2^{n+m}$ is greater than or equal to the at least N number of bit storage locations.

17. The interleaver according to claim 16, wherein the values of m and n are set such that n is greater than or equal to m and that the absolute value of the difference of values m and n is less than or equal to one.

18. The interleaver according to claim 17, wherein the controller is configured to reverse the bit storage locations for the first predetermined number of rows, reverse the bit storage locations for the second predetermined number of columns, and shift the bit storage locations of each of the second predetermined number of rows a respective predetermined number of columns for each data element when each individual data element is written to the matrix.

19. The interleaver according to claim 14, wherein the controller is configured to shift data elements in each particular row of the matrix a predetermined direction within the matrix a specified number of columns as determined by the relationship $2^m-(\text{row}\#-1)$, where row# is a number of the particular row in the matrix and $2^m$ is the total number of rows in the matrix.

* * * * *